United States Patent [19]

Braun et al.

[11] Patent Number: 4,685,065

[45] Date of Patent: Aug. 4, 1987

[54] PORTABLE SAMPLING SPECTRUM ANALYZER

[75] Inventors: Warren L. Braun; Walter M. Curt, both of Harrisonburg, Va.

[73] Assignee: ComSonics, Inc., Harrisonburg, Va.

[21] Appl. No.: 737,217

[22] Filed: May 23, 1985

[51] Int. Cl.[4] .................... G01R 23/06; G01R 31/28; G06F 15/36

[52] U.S. Cl. ................................ 364/485; 324/77 B; 358/139; 364/483; 364/550

[58] Field of Search ............... 364/485, 483, 481, 484, 364/550, 580; 371/20, 22, 29; 358/10, 139; 324/77 B, 77 CS

[56] References Cited

U.S. PATENT DOCUMENTS

| | | | |
|---|---|---|---|
| 4,207,431 | 6/1980 | McVoy | 358/139 |
| 4,241,416 | 12/1980 | Tarczy-Hornoch | 371/16 |
| 4,244,024 | 1/1981 | Marzalek et al. | 364/485 |
| 4,408,227 | 10/1983 | Bradley | 358/139 |
| 4,554,663 | 11/1985 | Pham van Cang | 371/20 |
| 4,561,093 | 12/1985 | Doane et al. | 371/20 |
| 4,578,638 | 3/1986 | Takano et al. | 364/485 |

OTHER PUBLICATIONS

"No Loose Ends" by Clifford B. Schrok, Published by Tektronix, Jun. 1973 pp. 1-17.

Primary Examiner—Felix D. Gruber
Attorney, Agent, or Firm—C. Lamont Whitham

[57] ABSTRACT

A portable spectrum analyzer using frequency synthesis is used in the field to perform voltage amplitude measurements of specified channel segments in a multichannel configured coaxial cable environment. The instrument is a microprocessor (28) based system, and includes an RF input (1) and keyboard (36) and function switch inputs and provides both aural and visual outputs by means of a speaker and an LCD display (27). A three stage frequency converter (7) including PLLs (11, 12 and 13) controlled by the microprocessor (28) allows for the automatic monitoring of a plurality of carrier channels or the display of both video and audio levels of a single channel. Automatic adjustment of the input signal level is provided by attenuator pads (2 and 3) controlled by the microprocessor (28). Calibration is also automatically controlled by the periodic injection of a signal of predetermined level from a noise source (4) under the control of the microprocessor (28). The microprocessor is programmed to provide several modes of operation including a sweep mode, a zoom mode, and a memory mode. In the sweep mode, the instrument continually scans all carrier channels automatically, each channel being presented sequentially and simultaneously in bar graph form on the LCD display (27). In the zoom mode, a single channel is displayed with both video and audio levels side by side. In the memory mode, the operator can view data saved from measurements previously made at a selected location in the cable system.

22 Claims, 9 Drawing Figures

INTERNAL DATA RAM

CODE SPACE

EXTERNAL DATA SPACE

PORTABLE SAMPLING SPECTRUM ANALYZER

MICROFICHE APPENDIX

Appended hereto as an appendix is a microfiche comprising a total of 60 frames containing a computer program listing referred to in the following specification.

TECHNICAL FIELD

The present invention generally relates to electrical test instruments such as field strength meters and spectrum analyzers and, more particularly, to a portable, battery powered instrument using frequency synthesis to perform voltage amplitude measurements of specified channel segments in a multichannel configured coaxial cable environment.

DESCRIPTION OF THE PRIOR ART

The proper management and operation of a coaxial cable communication system such as a CATV system requires periodic measurements of the signal levels of the several channels supported by the system. These measurements need to be made at various locations in the cable plant. Typically, a technician will make the measurements in the field using portable insturments. However, most portable test instruments rugged enough for use in the field are not capable of the several types of measurements that would provide the type of information required to properly diagnose the current state of operation of the system. Spectrum analyzers are well known as laboratory instruments, and there have been attempts to make such instruments portable and sufficiently rugged for field use. These attempts have only been marginally successful, but even where the instrument itself meets the requirements for field use, it suffers from the draw back that it is difficult to use. This is a direct result of adapting the laboratory instrument for use in the field, rather than designing an instrument for the specific application.

SUMMARY OF THE INVENTION

It is therefore and object of the present invention to provide an easy-to-use, portable spectrum analyzer with tuning intervals selected to allow analysis of cable television frequency allocations.

It is another object of the invention to provide a portable test instrument for use in the field which automatically presents the operator with an alphanumeric and graphical display of measured data.

It is a further object of the invention to provide a microprocessor based, sampling spectrum analyzer having a plurality of operator selectable modes of operation allowing for the automatic monitoring of a plurality of cable television visual carrier channels or the display of both video and audio levels of a single channel.

Yet another object of the invention is to provide a microprocessor based, sampling spectrum analyzer for cable television channel signal measurements which allows the operator to save complete channel information from a plurality of locations in the field.

Still another object of the invention is to provide a multitasking system for a microprocessor based, sampling spectrum analyzer which schedules tasks to occur at times based on current needs of the system.

According to the invention, channel tuning is achieved through frequency synthesis with tuning intervals selected to allow analysis of cable television frequency allocations. The instrument is provided with a liquid crystal display (LCD) which provides both bar graph and alphanumeric readout of data. There are several operational modes. In the sweep mode, the instrument continually scans all cable television visual carrier channels automatically, each channel being presented sequentially and simultaneously in bar graph form on the LCD display. The operator may select any available channel, and the selected channel will be displayed in an alphanumeric form as well as in the bar graph presentation. Both the channel designation and either visual or aural carrier field strength are displayed. In addition, visual and aural carrier functions are operator selectable. In the zoom mode, a single channel selected is displayed with both video and audio levels side by side in bar graph form. The memory mode allows the operator to save complete channel information from up to three system locations. In additon to these modes of operation, there is provided a configure mode which allows the operator to establish his system requirements in non-volitile memory thereby making the instrument a personalized piece of test equipment.

The portable sampling spectrum analyzer according to the invention is implemented as a microprocessor controlled system. The inputs to the system are the cable test point, a keyboard and various function switches. The outputs provided by the system are the LCD display and an audio speaker. The microprocessor is supported by electronically programmable read only memory (EPROM), random access memory (RAM), and nonvolitile RAM. The microprocessor controls, via output interfaces connected to the system bus, input attenuators, a frequency synthesizer converter, and the gain of an intermediate frequency (IF) section. The output of the IF section is supplied to an envelope detector, the output of which is supplied to an analog-to-digital (A/D) converter connected to the memory bus of the microprocessor. The necessary functions of the controlling software are divided into logical layers allowing easy future modification of the code. A distinguishing feature of the the software is the small multitasking operating system. This kernel schedules tasks to occur at times based on the current needs of the system.

BRIEF DESCRIPTION OF THE DRAWINGS

The foregoing and other objects, aspects and advantages of the invention will be better understood from the following detailed description of a preferred embodiment with reference to the drawings, in which.

DETAILED DESCRIPTION OF A PREFERRED EMBODIMENT OF THE INVENTION

System Overview

Figure 1A:
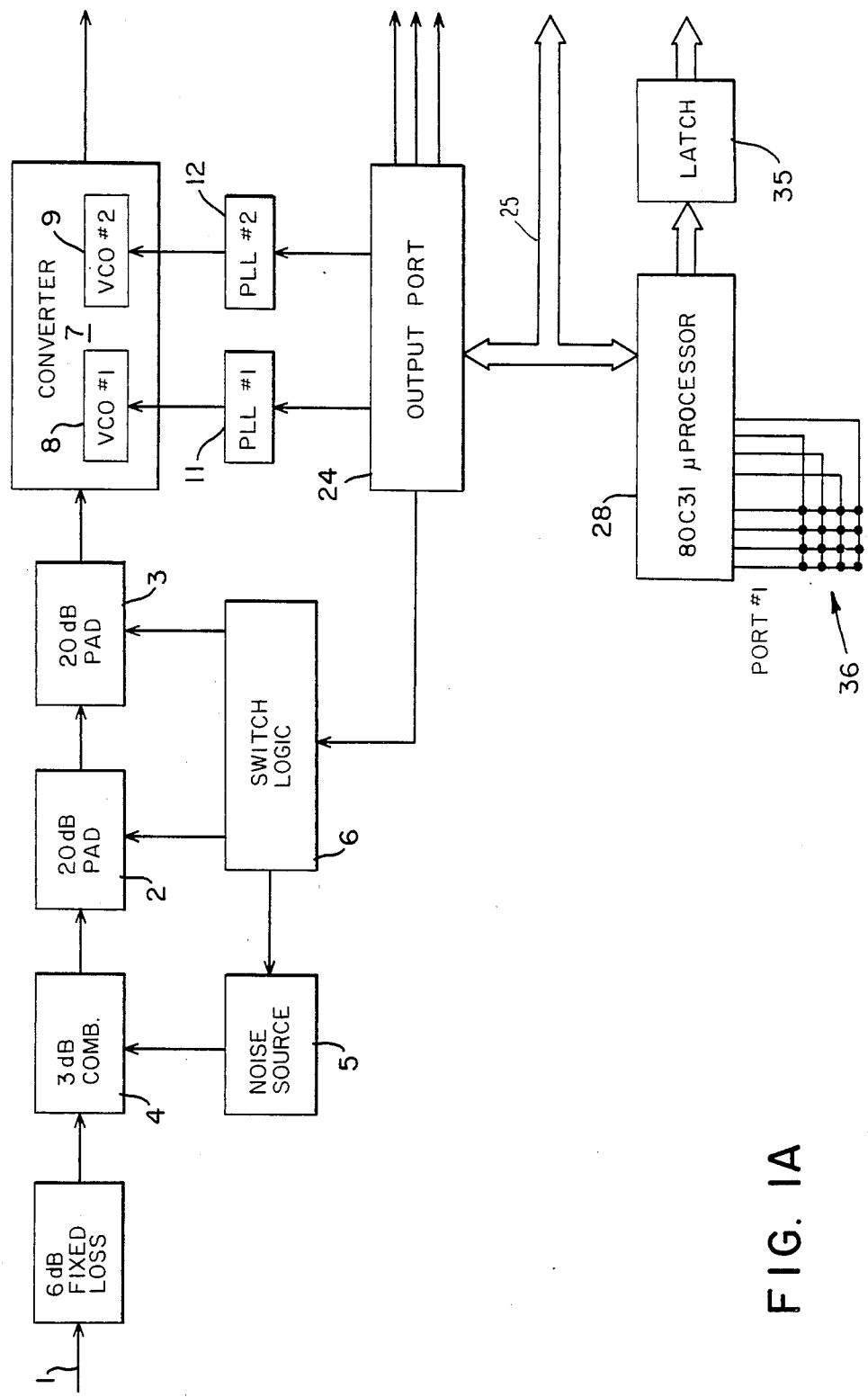
FIGS. 1A and 1B, taken together, are a block diagram of the overall system according to the invention.

Referring now to the drawings, and more particularly to FIG. 1A, the hardware of the system includes an input 1 connectable to a test point in the cable communications network. This input supplies series connected attenuator pads 2 and 3 via a 3 dB combiner 4. The other input of the 3 dB combiner is supplied by a noise source 5, which will be described in more detail hereinafter. The attenuator pads 2 and 3 and the noise source 5 are all controlled by outputs from switch logic 6.

The output of the 20 dB combiner 5 is supplied to the first stage of a two stage converter 7 which forms part of a three stage converter. The converter uses frequency synthesis techniques and includes voltage controlled oscillators (VCOs) 8, 9 and 10 (FIG. 1B) controlled, respectively, by phase locked loops (PLLs) 11, 12 and 13 (FIG. 1B).

Figure 1B:
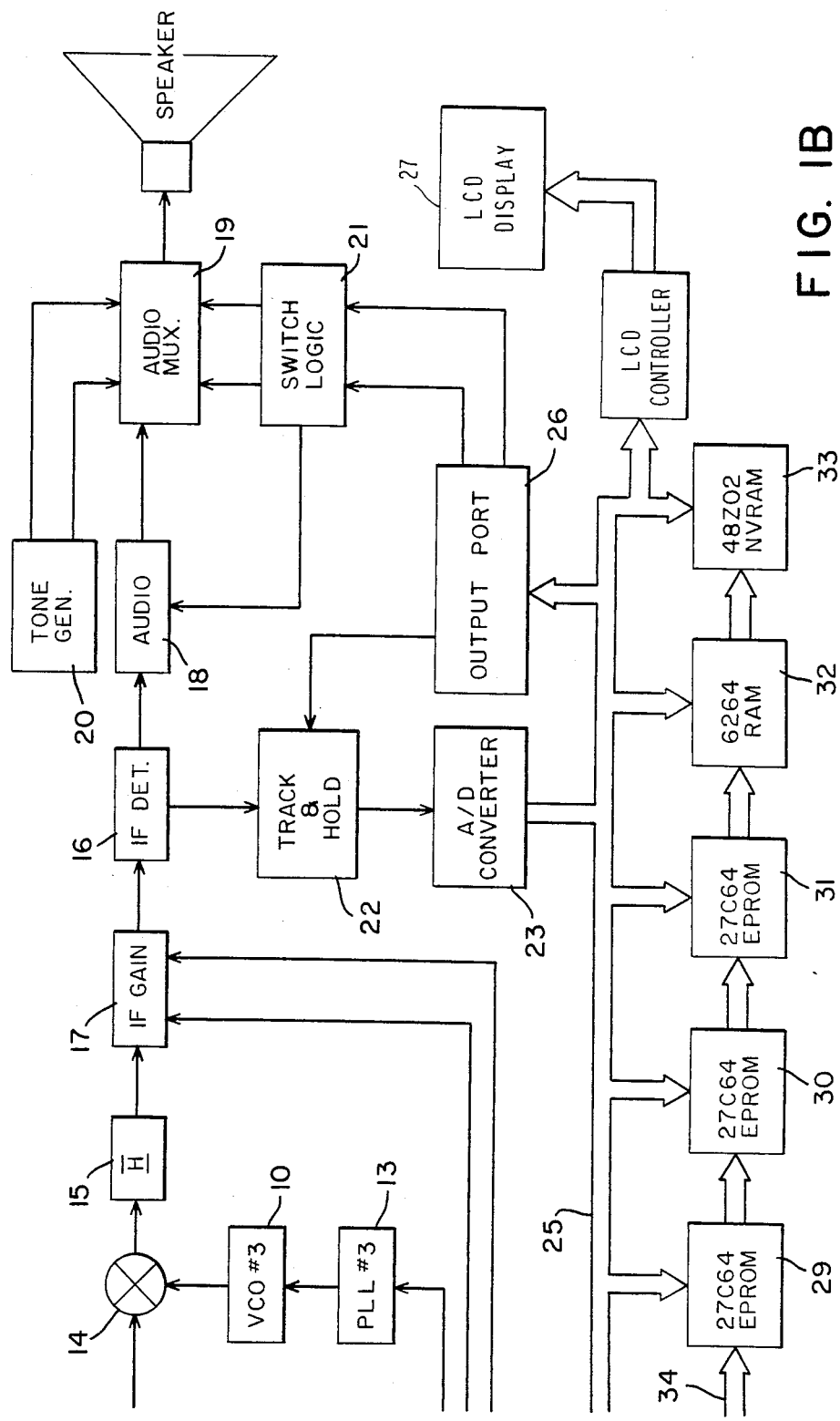

As shown in FIG. 1B, the output of the last stage is supplied by mixer 14 to a filter 15. The output of filter 15 is supplied to an IF detector 16 via a gain control circuit 17. Two outputs are obtained from IF detector 16. One is supplied to an FM (frequency modulation) audio detector 18 which, in turn, supplies an input to audio multiplex circuits 19. The audio multiplex circuits 19 also receive as inputs tones generated by tone generator 20. The selection of the audio signal output by the audio detector 18 and one or the other of the tones from tone generator 20 by the multiplex circuits 19 is controlled by the switch logic 21. The other output from the IF detector 16 is supplied to a track and hold circuit 22. The output of the track and hold circuit 22 is coupled to an analog-to-digital (A/D) converter 23.

The switch logic 6 and each of the PLLs 11, 12 and 13 are controlled via an output port interface 24 (FIG. 1A) connected to the system bus 25. Another output port interface 26 (FIG. 1B) connected to the system bus 25 provides the control signals to the switch logic 21 and the track and hold circuits 22. Also attached to the system bus 25 is an LCD display 27 and a microprocessor 28. Supporting memory for the microprocessor 28 is also connected to the bus. This memory includes three EPROMs 29, 30 and 31, a RAM 32 and a non-volitile RAM 33, all shown in FIG. 1B. The A/D converter 21 is connected to the RAM 32. The memory bus 34 is connected by a latch 35 to the microprocessor 28. Inputs to the microprocessor 28 are provided by a keyboard 36 (FIG. 1A).

User Interface

The system is capable of operating in several modes. The sweep mode is the power up default mode. At startup, the LCD display 27 will show all of the video signal levels for the 50 MHz to 550 MHz range. Actually, there are two different sweep modes, one for video and one for audio. The audio sweep mode displays all of the audio carriers and is selected by pressing the VIDEO/AUDIO key while in the video sweep mode. Once in the audio sweep mode, the operator can return to the video sweep mode by pressing the VIDEO/AUDIO key again.

Figure 2:
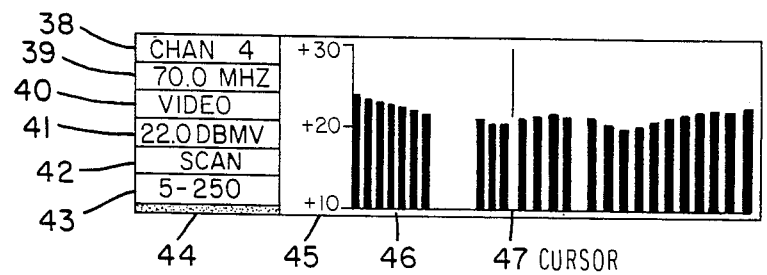
FIG. 2 is an illustration of the LCD display in the sweep mode of operation.

An example of the video sweep screen is shown in FIG. 2. The channel number is displayed in the upper left hand corner designated by the reference numeral 38. This channel display is configurable by the operator to display designations by either the EIA standard or the historical standard, i.e., numerics or alphanumerics. When viewing a sweep screen, the channel selection is performed by using the CURSOR keys to move the on-screen cursor 47 to the appropriate channel. As the cursor is moved, the channel number at 38 changes to reflect the channel that is directly below the cursor 47. On the line directly below the frequency display 39 is the video/audio status display 40. This display shows the operator which submode is currently active. The channel that the cursor 47 lies on has its absolute level in dBmV displayed at 41, and if the cursor is moved to a different channel, the new channel level is shown here. The status display at 42 shows which main mode of operation the instrument is in. As will be described, there are three modes whose status appear in this location. They are sweep, zoom, and memory. There are other modes of operation, but their display screens show mode status in different ways. Modes are selected by pressing valid function keys on the front of the instrument. At location 43, the sweep screen status display shows which range of frequencies is being displayed. There are two choices; 50 MHz to 550 MHz or 5 MHz to 250 MHz. To switch between these two ranges, the operator simply presses a button which toggles between the two ranges. An indication of relative battery voltage level is displayed in horizontal bar graph form at 44.

The main sweep screen is located directly to the right of the status display. The absolute level for each channel is displayed in bar graph form with the lower frequency channels to the left and the higher ones to the right. The on-screen range at 45 is set dynamically. It is 30 dBmV wide and is alignable to 5 dBmV increments; i.e., −40 to −20, −35 to −15, etc. The bar graph representation of the carriers themselves shown at 46 are side by side with no space in between. In a preferred display screen, each bar is three pixels wide, and each vertical pixel represents 0.25 dBmV. The channel selection cursor 47 video flashes over whatever is behind it so that it stands out from the background and sweep information.

The zoom mode of operation is entered directly from the video or audio sweep modes. When in either of those modes, if the SWEEP/ZOOM key is depressed, the display "zooms in" on the channel number that the cursor is currently pointing to.

Figure 3:
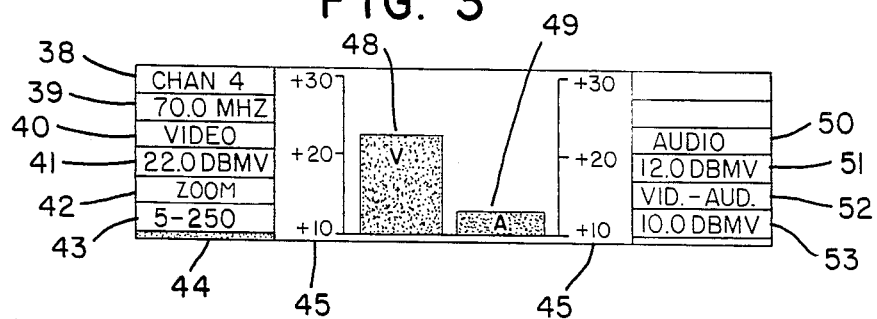
FIG. 3 is an illustration of the LCD display in the zoom mode of operation.

An example of the zoom scan screen is shown in FIG. 3 wherein like refernce numerals designate similar display features. As in the video and audio sweep modes, status information is displayed on the left side of the LCD display. Additional status information is also displayed in symmetrical form on the right hand side, leaving the center of the screen to the twin display of the audio and video carrier bar graphs 48 and 49, respectively. As before, the channel number is displayed at 38, and the frequency, at 39. By pressing the cursor keys, the next higher or lower channel can be selected. To delineate the fact that the status information on the left is for the video carrier, the status line 40 prominently displays the word VIDEO. The absolute level of the video signal is displayed at 41, and the mode, in this case ZOOM, is displayed at 42. The right side status information is headed by line 50 indicating that this is AUDIO information. The absolute level of the audio signal is displayed at 51. 52 is the visual header for the displayed difference between video and audio signal levels displayed at 53.

Figure 4:
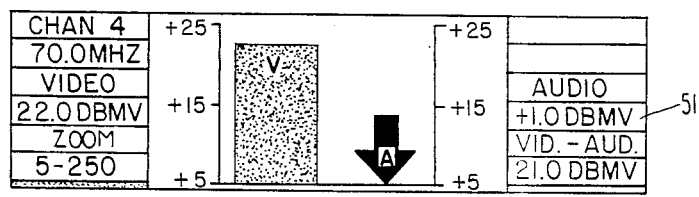
FIG. 4 is another illustration of the LCD display in the zoom mode of operation.

If the differential between video and audio signal strength exceeds 30 dBmV, which is the range of the bar graph display, then the audio bar will not be displayed. In its place will be an arrow pointing down to warn the operator that the audio level is below range. This screen is illustrated in FIG. 4. Note that the absolute audio level is still displayed at the status location 51.

While in the zoom mode, the operator can listen to the video sync buzz or the audio signal by depressing the VOLUME key once. With one press, the output is at low volume; with two presses, the output is at high volume; and with three presses, the speaker is off again. The VIDEO/AUDIO key selects which signal will be reproduced since it toggles between video and audio. The operator cannot listen to these signals in any other mode of operation.

The user can enter the memory mode only from the sweep mode, either audio or video, by pressing the MEMORY key once. In the memory mode, the screen will display the same information as before except that now the one screen information will not be updated. The mode display line 42 on the screen will show the user that he is in the memory mode and is now looking at "bin 0", which is a snapshot of the last screen displayed before entering the memory mode. The user can view stored scan screens by pressing the MEMORY key repeatedly. Once a sweep screen is selected, the user can operate on it just as in the normal sweep mode. The only difference is that the user can store a screen by selecting the bin to use, by pressing the MEMORY key, and pressing the STORE key and the MEMORY key simultaneously. What this does is take information from the snapshot in bin 0 memory and move it to permanent memory. In the preferred embodiment of the invention, up to three sweep screens can be saved in permanent memory using this technique.

In order for the operator to measure signal to noise, he must first tune to a blank video slot that has an adjacent video carrier. This can be done from either the video or zoom mode. The operator then would press down and hold the NOISE key. This causes the screen to clear and then display the value clearly at the center of the screen for as long as the NOISE key is depressed.

To measure hum, the operator must first tune to a CW (continuous wave) carrier while in either the sweep or zoom modes of operation. He would then depress and hold the HUM key. The screen would clear and then display the value clearly at the center of the screen for as long as the HUM key is depressed.

There is also a configure mode of operation that allows the operator to configure the system for his cable plant. A CONFIGURE key, preferably a small recessed button on the back of the instrument, places the system in the configure mode of operation when the key is pressed at power up. Once in this mode, the operator follows a simple set of menu screens that will lead him through the configure process of setting several options. The first of these options allows for the selection of system types; i.e., EIA or historic channel allocation and IRC, HRC or standard channel allocation. Once selected, this setting is stored in the non-volatile RAM 33 for semi-permanent reference, and channel information display will be based on this information. If no selection is made, then a default to standard is provided.

The configure mode will also set the channel status display to readout in either numerics or alphanumerics. For example, if numerics is selected, a numeral is displayed; but if alphanumerics is selected, an alpha character or an alpha character and a numeral are displayed. The numeric selection is the new standard, while the alphanumerics selection is the historical reference.

Using the configure option, the operator can force the system to display special frequencies in a noticable way and adjust the system for FAA (Federal Aviation Administration) offsets as well. More specifically, the "set pilots" option allows the operator to designate two of his visible channels as "pilot" freqencies. Whenever the system displays status information on these two channels, instead of displaying a channel number, the status display will show "Low Pilot" or "High Pilot". The operator can also set aside a special frequency for an RF (radio frequency) leak detector. When the system displays status information on this signal, the status display will show "Sniffer". If the cable plant has any special data frequencies, the system allows three to be uniquely displayed. These are user configurable and displayed as "Data 1", "Data 2", and "Data 3". In order to allow for small frequency adjustments to certain channels that reside near the FAA spectrum allocations, the FAA offsets selection enables the operator to shift the needed channels to their proper frequencies.

Finally, there is a help mode of operation. The help function is available from any command location of the system except while in the configure mode. The operator just presses the HELP key and then any other key to determine its function. The screen will display information about the key in question until the exit key is pressed. To exit the help mode, the operator only needs to press the EXIT key which returns the system to its condition before the HELP key was pressed.

Hardware

Figure 5:
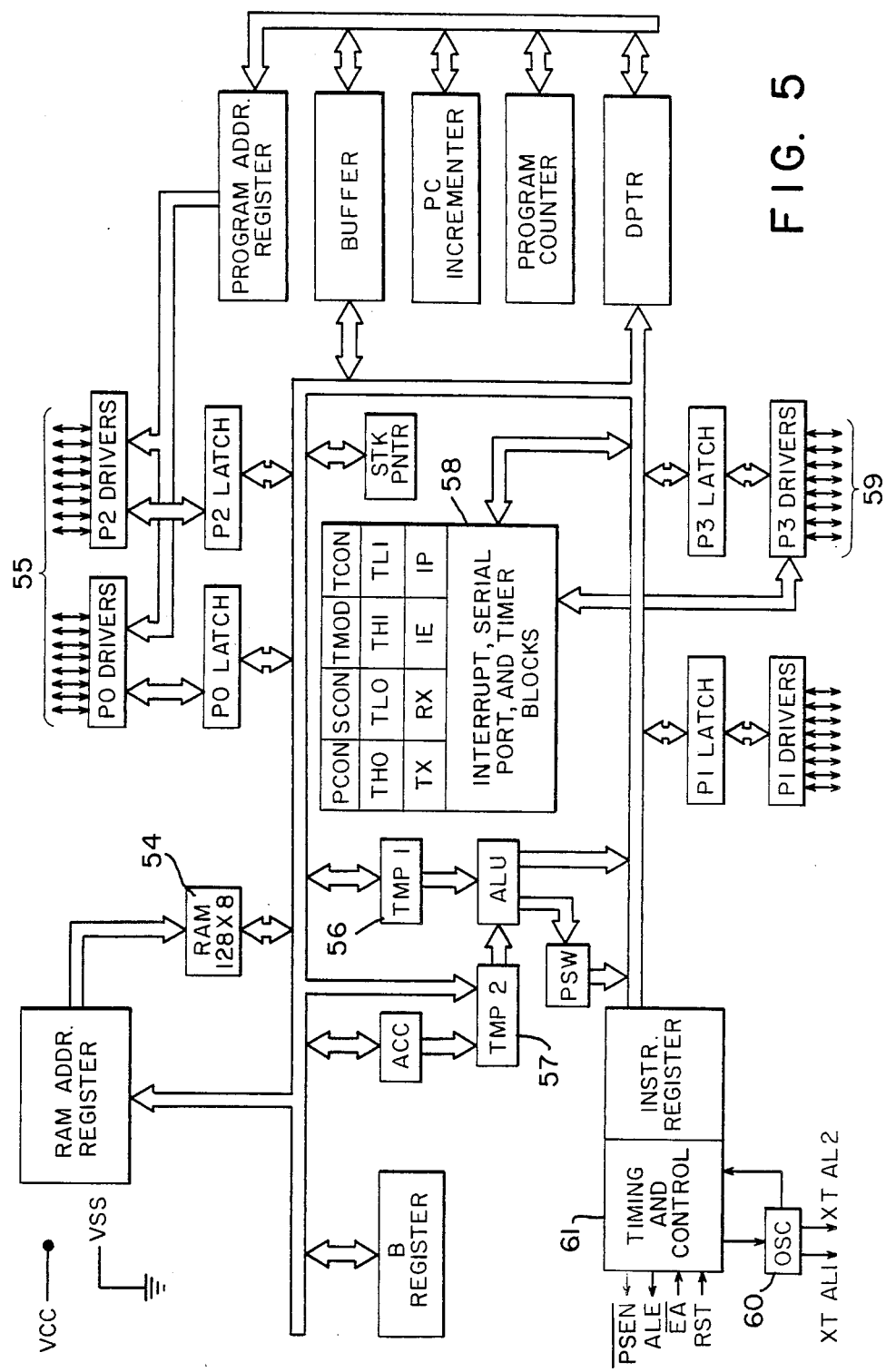
FIG. 5 is a block diagram of the microprocessor used in the preferred embodiment of the invention.

Since the instrument according to the invention must operate reliably in outdoor, harsh environments, it must automatically calibrate itself on a routine basis during operation. To accomplish this, the system has an internal temperature compensated noise source 5, shown in FIG. 1A, that can be switched into the system. The software has a table for the proper calibration adjustments and automatically makes the necessary changes. The procedure may be repeated periodically. At power up, a more extensive calibration routine is executed during which the message "Now Calibrating" is displayed on the LCD display 27. Also at power up, the system executes a series of diagnostic tests. The results of these tests are displayed on the LCD display 27. The tests executed and the results displayed are generally as follows:

1. Central Processor Test: OK
2. Memory: OK
3. Analog: OK
4. Power: OK
5. RF: OK
6. Now Calibrating: OK In the preferred embodiment of the invention as actually implemented, the microprocessor 28 consists of an Intel 80C31 8-bit CMOS microprocessor with 24,576 bytes of external code space residing on three Intel 27C64 EPROMs. The internal architecture of the 80C31 is shown in block diagram form in FIG. 5. This microcomputer features 128 bytes of RAM 54, 32 input/output (I/O) lines 55, two 16-bit timers 56 and 57, a five-source, two-level interrupt structure 58, a full duplex serial port 59, and on chip oscillator and timing and control circuits 60 and 61, respectively. In addition, the 80C31 has two software selectable modes of reduced activity for further reduction in power consumption. In the idle mode, the RAM 54, timers 56 and 57, interrupt system 58, and the serial port 59 remain active while the rest of the system is frozen. In the power down mode, the RAM is saved and all other functions are inoperative. Further information on the 80C31 microcomputer may be obtained from the manufacturer, Intel Corp.

Figure 6:
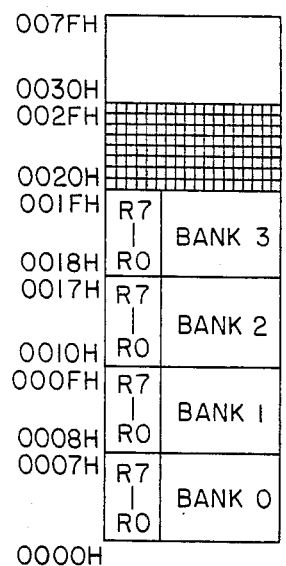
FIG. 6 is a memory map of the internal data RAM for the microprocessor.

The internal memory space is broken up into four banks of registers, a set of bit by bit programmable special function registers, and 100 bytes of internal 8-bit wide high speed RAM memory 54. A memory map of this RAM is shown in FIG. 6. The internal data RAM 54 holds the run time stack, the working registers, and the temporary variables for the system while it is in operation. This internal RAM will also hold temporary information when the system is placed in the idle mode.

Figure 7:
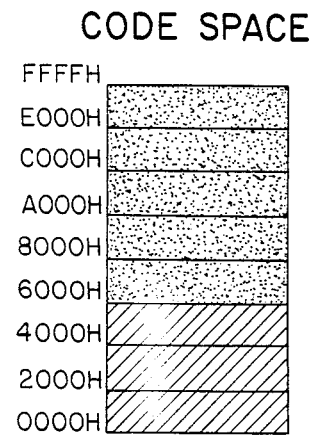
FIG. 7 is a memory map of the external data space.

The microprocessor 28 accesses all external devices through a memory mapped I/O scheme that maps all devices into the upper 8K bytes of external address space. Data memory 32 has access, on 8K boundaries, to the other 56K bytes of space. Not all of the available memory or I/O space is used, allowing room for future expansion. The external memory map is shown in FIG. 7. Code space consists of the three 8K byte EPROMs. All of the executable machine instructions reside in these EPROMs. Those skilled in the art will recognize that the economies of large scale manufacturing could allow some of this code to be moved onto internal processor ROM. The memory map for the code space is shown in FIG. 8.

Figure 8:
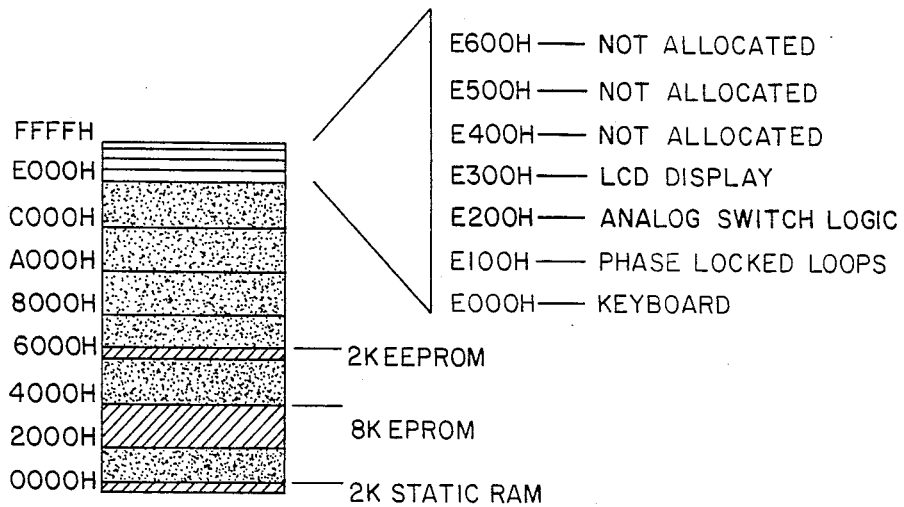
FIG. 8 is a memory map of the code space for the executable machine instructions in read only memory (ROM).

Thus, the memory maps of FIGS. 7 and 8 represent the contents of data and code memories 29, 30, 31, and 32 shown in FIG. 1. The EPROMs are, in the preferred embodiment, Intel 27C64 8K by 8-bit wide CMOS devices. The nonvolitile RAM 33 may be a conventional volitile CMOS RAM with a continuous battery power supply which is on even when the system is turned off. This memory 33 holds all of the configure mode values and the memory screens. The static RAM 32 holds all temporary screen images and many of the non-time critical program variables. The configure data and the calibration adjustment tables are moved from non-volitile memory 33 to RAM 32 immediately after power up. The values output from the A/D converter 21 are also stored in the RAM 32. In the preferred embodiment, the RAM 32 is an ultra-low power CMOS 8K by 8-bit wide RAM made by Toshiba.

There are no real I/0 ports; rather, all of the input and output is memory mapped to and from 8-bit CMOS latches 35 composed of 74HC373 devices. All gain, attenuator pad, volume, keyboard, switch, noise source, and phase lock loop controls are driven from specific bits on the latches' inputs and outputs.

In the preferred embodiment, the LCD display 27 is one that is manufactured by Hitachi and provides a resolution of 128 pixels high by 480 pixels wide. This size allows the operator to view all of the information that has been previously described. The display data resides in the external processor data space and is treated as two contiguous bytes of that space. The keyboard 36 is connected to port number 1 of the microprocessor 28. The physical keyboard used is preferrably an environmentally sealed conductive rubber type device.

Turning now to the interface between the digital and analog circuits, the A/D converter 23 is a 12-bit CMOS device with an external voltage reference. The A/D converter is prefereably a 1205 A/D converter manufactured by National. There are a series of front end analog multiplexers that allow the microprocessor to select the input to the A/D converter. The levels measured include signal level, battery level, DC/DC converter outputs and temperature sensor voltages.

The three phase lock loops 11, 12 and 13 are programmable by the microprocessor 28 through a simple serial protocol. These PLLs tune the VCOs 8, 9 and 10 to the proper channel under direct software control. The first PLL steps the device in 6 MHz frequency increments, the second PLL is set to a fixed frequency, and the third PLL advances the output in 50 MHz increments.

The output of the converter from filter 15 is provided to the FM detector 16 which may be an RCA 3089A FM IF subsystem integrated circuit. The chip provides a meter drive pinout connection from the output side of the limiting amplifiers. This meter drive signal is inherently logarithmic, and so no special hardware is required for the desired amplitude display.

In order to demodulate the video carrier, a simple peak detector is employed in the track and hold circuits 22. Sampled DC, proportional to the peak amplitude of the measured carrier is applied to the input of the A/D converter 23 for display processing. A simple ratio detector is used to demodulate the IF into baseband audio for driving the speaker.

At the input, the front end attenuator pads 2 and 3 and the noise source are also controlled by the microprocessor 28. The attenuator pads keep the input signal to the converter 7 at an acceptable level of between +10 to +20 dBmV. Attenuator pad 2 supplies 20 dB attenuation, and attenuator 3 supplies 20 dB attenuation. This provides switched combination of 0, 20 and 40 dB. The microprocessor maintains proper calibration of the instrument by turning off the input signal, switching on the noise source 5, and taking level readings. The readings, along with temperature and individual unit calibration information allow the software to constantly adjust the instrument for optimum performance. The microprocessor makes appropriate adjustments based on the temperature of the instrument as read from the thermister.

Software

The code chosen for the software is PL/M, an Intel Corporation special microprocessor language. This language is compiled and, once compiled, is extremely efficient in the generation of the target processor's machine code. An example of a PL/M code for setting the phase lock loop internal shift registers is privided in the appended microfiche.

By dividing the necessary functions in the software into logical layers, the code generated can be modified easily. All that is necessary for the newly added code to replace old code is for it to accept the same input(s) and return the proper value(s). Thus, to add a different display, it is only necessary to rewrite the lowest level functions. Rewritting the software that provides the output to the screen is not required.

A distinguishing feature of the software for the portable sampling spectrum analyzer according to the invention is the small, time based operating system that orchestrates all functions. This kernel schedules tasks to occur at times based on the present needs of the system. The system is actually a fairly complex finite state machine which derives all of its state information from the external keyboard. The three units of the operating system are the tasker, scheduler, and clock. There are no priorities except time of execution, although those skilled in the art will recognize that priorities can be easily added to the system. Further, time of execution is not guaranteed by the tasker, only that the scheduled routine will not execute before the time requested. Thus, the operating system is not a "real time" operating system.

The scheduler is called with the address of the next procedure to be executed and with the time from now at which it should be executed. It then sorts the task, by time, with other tasks in a wait list. Up to ten tasks can be in the wait list.

The granularity of the system clock is one millisecond. Every clock tick causes the processor to be interrupted with the highest priority interrupt in the system (i.e., no other process can interrupt the clock), and look at the lowest time in the wait list. If the time (or times if more than one task has the exact same delay) is at zero, then the clock routine removes the task(s) address from the wait list and places it in the ready list. Up to ten tasks can be in the ready list.

The tasker is called once at system startup and given the first address of a process to execute, and it is never directly called again. It then sets up the wait and ready lists, and executes the first process. If during the course of events no process is in the ready list after the previously executing process has released to the tasker, the tasker will put the microprocessor in the "sleep mode" to reduce the power consumption to one tenth that of normal operation, and wait for a clock tick interrupt. To restate the tasker operation, the tasker is always running in the background, it calls procedures to be executed by their addresses in the ready list, and when the procedures terminate, control returns to the tasker. It should be noted that one ramification of this design is that if no tasks are in the ready and wait lists, the system will hang in the tasker waiting for a task to appear in the ready list. The user of the operating system must therefore be sure that scheduled tasks in turn schedule other tasks to form an unbroken succession of scheduled events from power up to power down. The hardware includes a "watchdog" timer that will reset the microprocessor if not written to within a short period of time. The watchdog timer is strobed every time the tasker calls a procedure to execute and is thus reset. This means that if the task that is executing takes longer than the watchdog quanta, or the ready and wait list both become empty, the entire system will be reset. The tasker module is set forth in the PL/M listing in the appended microfiche.

The input/output library of the system includes all the procedures that control the LCD display, A/D converter, multiplex circuits, phase lock loops, track and hold circuits, keyboard, switchable attenuators, IF gain circuitry, and audio circuits. These procedures are called by the upper level tasks to perform specific functions at the lowest level in the hardware. They are generally layered so that a change in the exact hardware device will only require a change in the functional control layer of the software, the functional request will not change unless the product specifications are changed. Some of the more useful procedures are listed in the appended microfiche.

Keymode is the software that controls all the user interface to the system. It displays data and screen templates and decides what to do with valid key presses. In the appended microfiche is the list of variables used in keymode, with the values they may assume, and a list of the possible keys that could be pressed in any mode.

The appended microfiche contain the PL/M program listings for the keyboard control and the input/output library for the system.

While we have described our invention with respect to a preferred embodiment thereof, those skilled in the art will understand that changes may be made therein without departing from the spirit and scope of our invention.

What is claimed is:

1. A portable sampling spectrum analyzer for making field measurements in a multichannel configured coaxial cable communication system, comprising:
   a microprocessor;
   memory means connected to said microprocessor for storing control code and data;
   switch means connected to said microprocessor for providing operator input signals to said microprocessor;
   signal selecting means connectable to a coaxial cable and controlled by said microprocessor for sampling in time a plurality of predetermined frequency channels of a coaxial cable communication system by selectively tuning a plurality of said channels at times determined by said microprocessor;
   signal detection means connected to receive the output of said signal selecting means for storing sampled data in said memory means; and
   visual display means connected to said microprocessor for displaying measured sampled data in at least one mode that displays data for all said predetermined frequency channels simultaneously.

2. The portable sampling spectrum analyzer recited in claim 1 wherein said microprocessor is programmed to provide a plurality of modes of operation including a sweep mode in which said visual display means displays video or audio signal levels of said plurality of frequency channels simultaneously.

3. The portable sampling spectrum analyzer recited in claim 2 where said microprocessor is further programmed to provide a zoom mode in which said visual display means displays sampled video and audio signal levels of a single frequency channel, the displayed video and audio signal levels being periodically updated.

4. The portable sampling spectrum analyzer recited in claim 3 wherein said microprocessor is programmed to provide a memory mode in which said visual display means displays previously measured data for a selected location in said coaxial cable.

5. The portable sampling spectrum analyzer recited in claim 3 further comprising means for selecting a single frequency channel to be displayed in said zoom mode and wherein said visual display means comprises:
   first display area for displaying said video and audio signal levels of a selected channel in bar graph form;
   second display area for displaying channel number, frequency, carrier type, and signal strength for the sampled video signal; and
   third display area for displaying type of carrier, the absolute signal strength of the audio signal, and the difference in the signal strengths of the video and audio signals.

6. The portable spectrum analyzer recited in claim 5 wherein said means for selecting comprises:
  means for displaying a cursor on said visual display means;
  means for moving said cursor to a point on said visual display means corresponding to a signal frequency channel to be selected; and
  means for providing an input signal to said microprocessor indicating the selection of a single frequency channel.

7. The sampling spectrum analyzer recited in claim 2 wherein said switch means includes cursor keys for controlling a cursor displayed by said visual display means, said microprocessor being responsive to the operation of said cursor keys in said sweep mode of operation for moving said cursor and providing a display of channel information for the channel selected by said cursor.

8. The portable sampling spectrum analyzer recited in claim 2 wherein said switch means includes a video/audio key, said microprocessor being responsive to the operation of said video/audio key in said sweep mode of operation for toggling between displays on said visual display means of video data and audio data for said plurality of frequency channels.

9. The portable sampling spectrum analyzer recited in claim 1 further comprising means for selecting a single frequency channel of said plurality of predetermined frequency channels and wherein said visual display means comprises:
  first display area for displaying the stored data for each sampled frequency channel in bar graph form to show relative signal strengths of said sampled frequency channels; and
  second display area for displaying a channel number, frequency, type of carrier, and signal strength for the selected single frequency channel.

10. The portable sampling spectrum analyzer recited in claim 9 wherein said means for selecting a single frequency channel comprises:
  means for displaying a cursor on said visual display means;
  means for moving said cursor to a bar graph corresponding to the channel to be selected; and
  means for inputing a selection signal to said microprocessor.

11. The portable sampling spectrum analyzer recited in claim 1 further comprising attenuator means connected between the input of said signal selecting means and a test point on said coaxial cable and controlled by said microprocessor for automatically maintaining the input signal level within predetermined limits.

12. The portable sampling spectrum analyzer recited in claim 1 further comprising calibration means connected between the input of said signal selecting means and a test point on said coaxial cable and controlled by said microprocessor for substituting a noise signal of predetermined level for the input signal at said test point to automatically calibrate said spectrum analyzer.

13. A method of making field measurements in a multichannel configured coaxial cable communication system comprising the steps of:
  sampling in time a plurality of predetermined frequency channels of a coaxial communication system by selectively tuning a plurality of said frequency channels at determined times;
  detecting signal strength on each sampled frequency channel and storing data corresponding to the detected signal strength for each sampled frequency channel in memory;
  updating the data stored in memory for each sampled frequency channel by reading into memory the most recently detected signal strength for the sampled frequency channel; and
  reading out the data stored in memory and displaying the stored data for each sampled frequency channel in bar graph form on a common display to show relative signal strengths of the sampled frequency channels.

14. The method of making field measurements as recited in claim 13 further comprising the steps of:
  selecting a single frequency channel of said plurality of predetermined frequency channels; and
  displaying channel number, frequency, type of carrier, and signal strength for the selected single frequency channel.

15. The method of making field measurements as recited in claim 14 wherein the step of selecting is performed by the steps of:
  displaying a cursor on said common display;
  moving said cursor to a bar graph corresponding to a single frequency channel to be selected; and
  selecting the single frequency channel having a bar graph at the position of the cursor.

16. The method of making field measurements as recited in claim 13 wherein said steps of sampling is performed by sampling both a video signal and an audio signal and said step of displaying is performed in a sweep mode wherein data for all sampled frequency channels are displayed on a single display, said method further comprising the steps of:
  switching the mode of display to a zoom mode in which the sampled data for a single frequency channel of the coaxial cable communication system is displayed;
  selecting a single frequency channel of said plurality of predetermined frequency channels for display of video and audio signal strengths; and
  reading out sampled video and audio signal strength data from memory for the selected frequency channel and displaying the sampled video and audio signal levels of the selected frequency channel in bar graph form on the display.

17. The method of making field measurements as recited in claim 16 wherein the step of selecting is performed by the steps of:
  displaying a cursor on said common display;
  moving the cursor to a bar graph corresponding to a single frequency channel to be selected; and
  selecting the single frequency channel having a bar graph at the position of the cursor.

18. The method of making field measurements as recited in claim 16 further comprising the steps of:
  displaying channel number, frequency, carrier type, and signal strength for the sampled video signal; and
  displaying the type of carrier, the absolute signal strength of the audio signal, and the difference in the signal strengths of the video and audio signals.

19. The method of making field measurements as recited in claim 13 wherein the steps of sampling, detecting signal strength and storing data corresponding to the detected signal strengths of said plurality of channels is performed at a plurality of locations in said coaxial cable communication system, said method further comprising the steps of:

switching the mode of display to a memory mode and separately storing data corresponding to the detected signal strengths for said plurality of sampled frequency channels according to the location where the steps of sampling and detecting are performed; and selecting the data stored in memory for one of said locations and displaying the data for said plurality of frequency channels in bar graph form on a common display, the data stored in memory mode in the memory remaining static.

20. The method of making field measurements as recited in claim 13 further comprising the step of automatically maintaining the input signal level for each of said predetermined frequency channels within predetermined limits.

21. The method for making field measurements as recited in claim 13 further comprising calibrating the measurements of detected signal strength for each of said predetermined frequency channels by performing the steps of:

automatically substituting a noise source of known signal strength as the input signal to be detected; and calibrating subsequent measurements to the measured signal strength of said noise source.

22. The method for making field measurements as recited in claim 13 further comprising the step of switching between a display of video data and a display of audio data for said plurality of predetermined frequency channels.

* * * * *